US012772437B2

(12) United States Patent
Choi et al.

(10) Patent No.: US 12,772,437 B2
(45) Date of Patent: Oct. 20, 2026

(54) SEMICONDUCTOR DEVICE HAVING A BUFFER STRUCTURE

(71) Applicant: Samsung Electronics Co., Ltd., Suwon-si (KR)

(72) Inventors: Ahrang Choi, Hwaseong-si (KR); Chansic Yoon, Anyang-si (KR); Hoin Ryu, Suwon-si (KR); Junghoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 787 days.

(21) Appl. No.: 17/880,723

(22) Filed: Aug. 4, 2022

(65) Prior Publication Data

US 2023/0209808 A1 Jun. 29, 2023

(30) Foreign Application Priority Data

Dec. 27, 2021 (KR) ........................ 10-2021-0187998

(51) Int. Cl.
*H10B 12/00* (2023.01)
*H10W 20/00* (2026.01)

(52) U.S. Cl.
CPC ........... *H10B 12/34* (2023.02); *H10B 12/053* (2023.02); *H10B 12/315* (2023.02); *H10B 12/48* (2023.02); *H10B 12/485* (2023.02); *H10W 20/092* (2026.01)

(58) Field of Classification Search
None
See application file for complete search history.

(56) References Cited

U.S. PATENT DOCUMENTS

| | | | | |
|---|---|---|---|---|
| 8,669,152 B2 * | 3/2014 | Ryu | ........................ | H10B 12/09 438/197 |
| 9,437,697 B2 | 9/2016 | Cho | | |
| 9,985,034 B2 | 5/2018 | Yoon et al. | | |
| 10,050,041 B1 | 8/2018 | Yoon et al. | | |
| 10,879,398 B2 | 12/2020 | Lee et al. | | |
| 10,910,363 B2 | 2/2021 | Lee et al. | | |
| 11,121,135 B1 * | 9/2021 | Ikeda | ................... | H10B 12/485 |
| 2020/0194436 A1 | 6/2020 | Kim et al. | | |
| 2020/0373306 A1 * | 11/2020 | Kim | ...................... | H10B 12/033 |
| 2020/0402981 A1 * | 12/2020 | Kim | ................... | H10B 12/0335 |
| 2021/0098460 A1 * | 4/2021 | Lee | ....................... | H10B 12/053 |
| 2021/0126098 A1 | 4/2021 | Lee et al. | | |
| 2022/0059543 A1 * | 2/2022 | Mun | .................. | H10B 12/0335 |
| 2022/0271044 A1 * | 8/2022 | Kim | ...................... | H10B 12/482 |
| 2022/0384449 A1 * | 12/2022 | Kim | ................... | H10B 12/0335 |

* cited by examiner

*Primary Examiner* — William Henry Anderson
(74) *Attorney, Agent, or Firm* — Muir Patent Law, PLLC

(57) ABSTRACT

A semiconductor device includes active regions defined by a device isolation region in a substrate; trenches extending in a first direction to intersect the active regions; buried gate structures buried in the trenches, respectively, and having upper surfaces located on a level lower than a level of upper surfaces of the active regions; a buffer structure covering the active regions, the isolation region, and the buried gate structures; bit line structures extending in a second direction intersecting the first direction on the active regions and connected to the active regions; storage node contacts between the bit line structures, penetrating through the buffer structure and in contact with the active regions; and capacitor structures in contact with an upper surface of the storage node contacts.

20 Claims, 17 Drawing Sheets

SEMICONDUCTOR DEVICE HAVING A BUFFER STRUCTURE

CROSS-REFERENCE TO RELATED APPLICATION(S)

This application claims benefit of priority under 35 U.S.C. § 119 to Korean Patent Application No. 10-2021-0187998, filed on Dec. 27, 2021, in the Korean Intellectual Property Office, the disclosure of which is incorporated herein by reference in its entirety.

BACKGROUND

Example embodiments of the present disclosure relate to a semiconductor device.

As integration density of a semiconductor device has increased, design rules for components of a semiconductor device have decreased. In a highly scaled semiconductor device, a process of forming a plurality of wiring lines and a plurality of buried contacts (BC) interposed therebetween has become complex and somewhat difficult. As for a buried channel memory device, as a distance between a direct contact (DC) region and a buried contact region decreases, various issues such as misalignment and not-open failure may occur.

SUMMARY

An example embodiment of the present disclosure is to provide a semiconductor device in which distribution of recesses in a storage node may be improved according to improvement of a profile of a buffer structure.

An example embodiment of the present disclosure is to provide a method of manufacturing a semiconductor device which may reduce process burden by reducing the amount of etching of a storage node contact hole.

According to an example embodiment of the present disclosure, a semiconductor device includes active regions defined by a device isolation region in a substrate; trenches extending lengthwise in a first direction to intersect the active regions; buried gate structures buried in the trenches, respectively, and having upper surfaces located on a level lower than a level of upper surfaces of the active regions; a buffer structure covering the active regions, the device isolation region, and the buried gate structures; bit line structures extending lengthwise in a second direction intersecting the first direction on the active regions and connected to the active regions; storage node contacts between the bit line structures, penetrating through the buffer structure and in contact with the active regions; and capacitor structures in contact with an upper surface of the storage node contacts, wherein the buffer structure includes a first buffer pattern extending along profiles of the upper surfaces of the active regions, the device isolation region, and the buried gate structures and having an upper surface including concave portions; a second buffer pattern including at least first portions filling the concave portions of the upper surface of the first buffer pattern; and a third buffer pattern on the first buffer pattern and the second buffer pattern.

According to an example embodiment of the present disclosure, a semiconductor device includes active regions defined by a device isolation region in a substrate; word lines buried in the substrate, extending lengthwise in a first direction, and located on a level lower than a level of an upper surface of the substrate; capping patterns buried in the substrate, located on the word lines, and having an upper surface located on a level lower than a level of an upper surface of the substrate; and a buffer structure on the device isolation region, the active regions, and the capping patterns, wherein the buffer structure includes a first region on the active regions and the device isolation region, and a second region on the capping patterns, wherein the first region has a first thickness, and wherein the second region has a second thickness greater than the first thickness.

According to an example embodiment of the present disclosure, a semiconductor device includes an isolation region defining an active region within a substrate; buried gate structures intersecting the active region, extending lengthwise into the isolation region, and having upper surfaces located on a level lower than a level of an upper surface of the active region; a first buffer pattern on the buried gate structures and the isolation region, and having upper surfaces including concave portions on the buried gate structures; and a second buffer pattern filling the concave portions of the upper surface of the first buffer pattern and including at least first portions vertically overlapping the buried gate structures.

According to an example embodiment of the present disclosure, a method of manufacturing a semiconductor device, the method comprising: forming a trench by etching a portion of a substrate in a first direction; forming a buried gate structure in the trench; etching the buried gate structure to a level lower than an upper surface of the substrate; forming a first buffer pattern covering the buried gate structure and the substrate along profiles of upper surfaces of the buried gate structure and the substrate; forming a second buffer pattern covering the first buffer pattern along a profile of an upper surface of the first buffer pattern; and planarizing the second buffer pattern.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings. Like numbers refer to like elements throughout. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

A semiconductor device will be described with reference to FIGS. 1 to 3B according to example embodiments.

Figure 1:
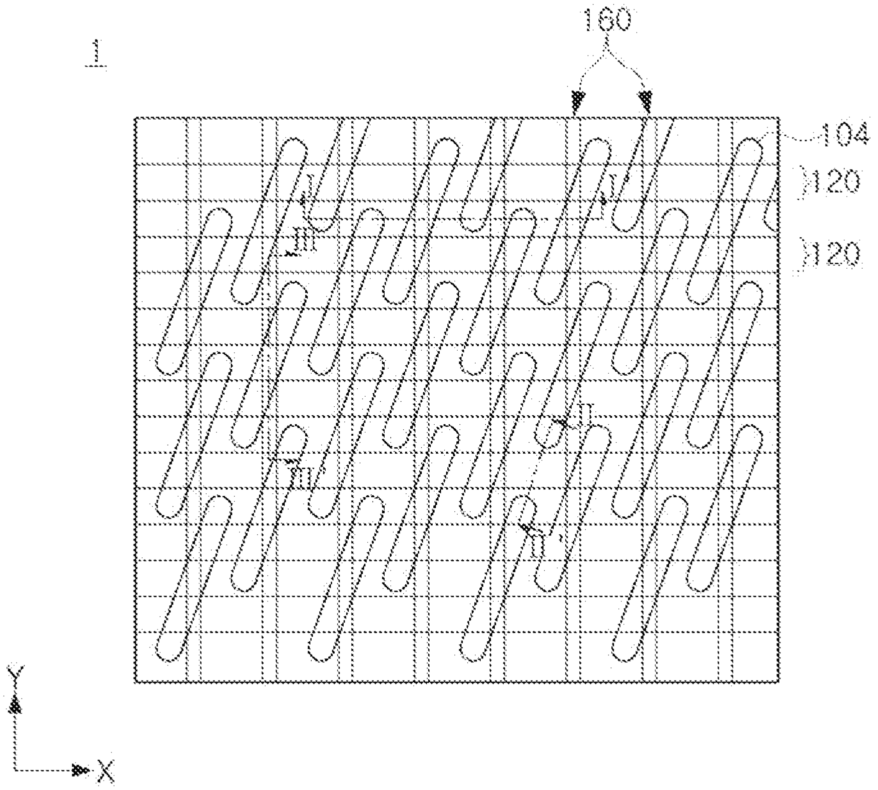
FIG. 1 is a plan diagram illustrating a semiconductor device, according to an example embodiment of the present disclosure.

FIG. 1 is a plan diagram illustrating a semiconductor device according to an example embodiment.

Figure 2A:
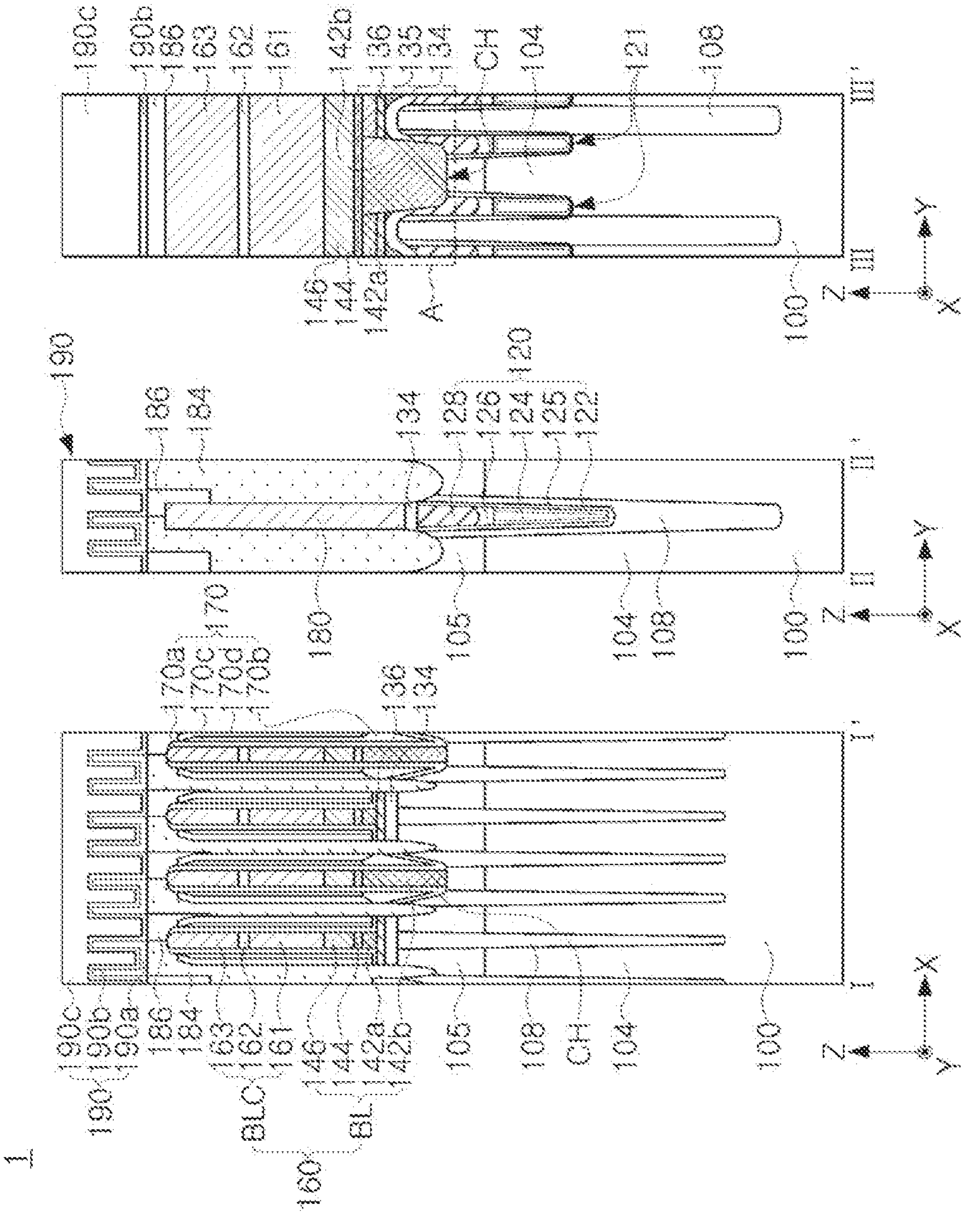
FIGS. 2A and 2B are cross-sectional diagrams illustrating a semiconductor device, according to an example embodiment of the present disclosure.
Figure 2B:
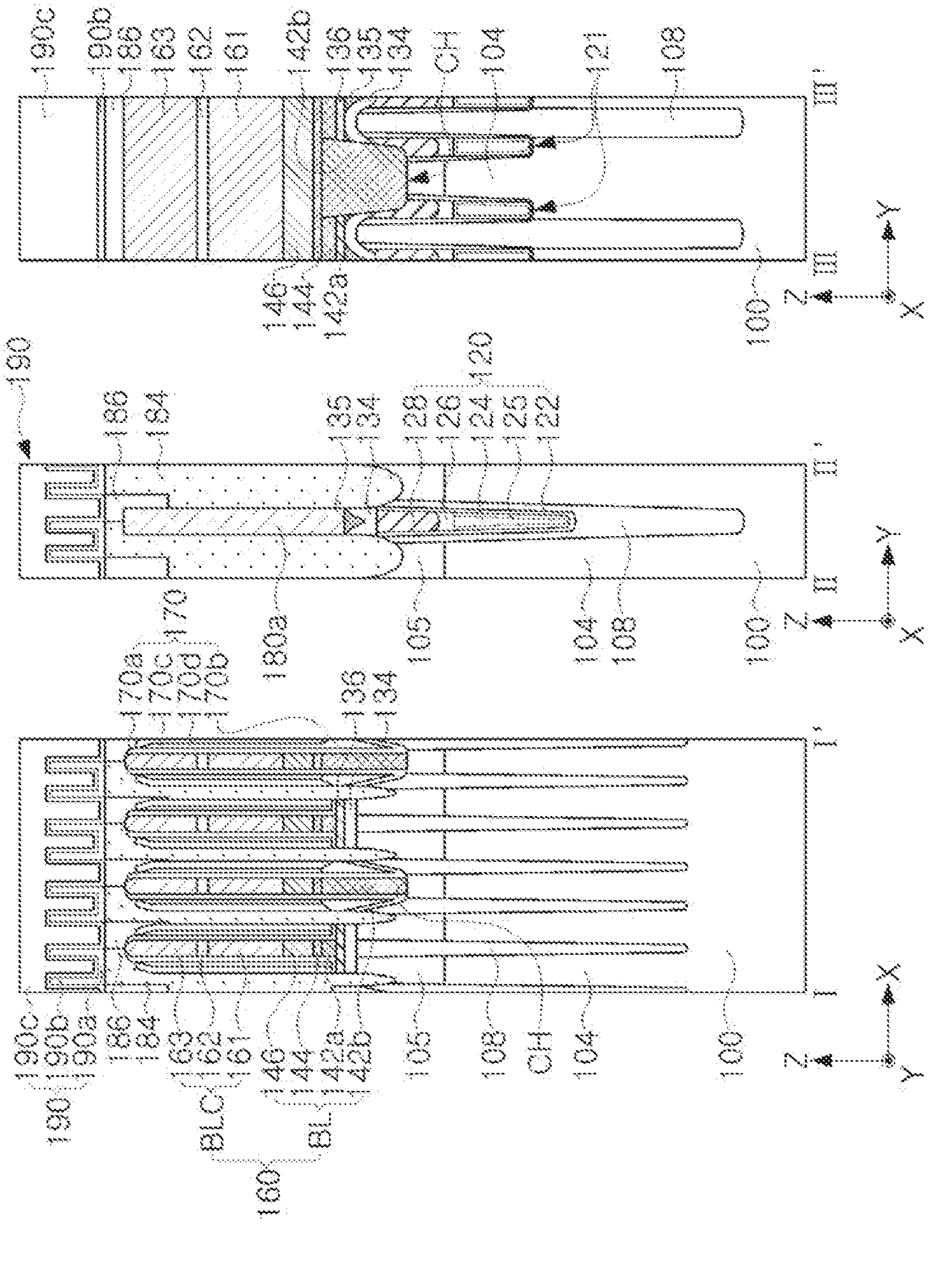

FIGS. 2A and 2B are cross-sectional diagrams illustrating a semiconductor device according to an example embodiment, taken along lines I-I', II-II', and III-III'.

Figure 3A:
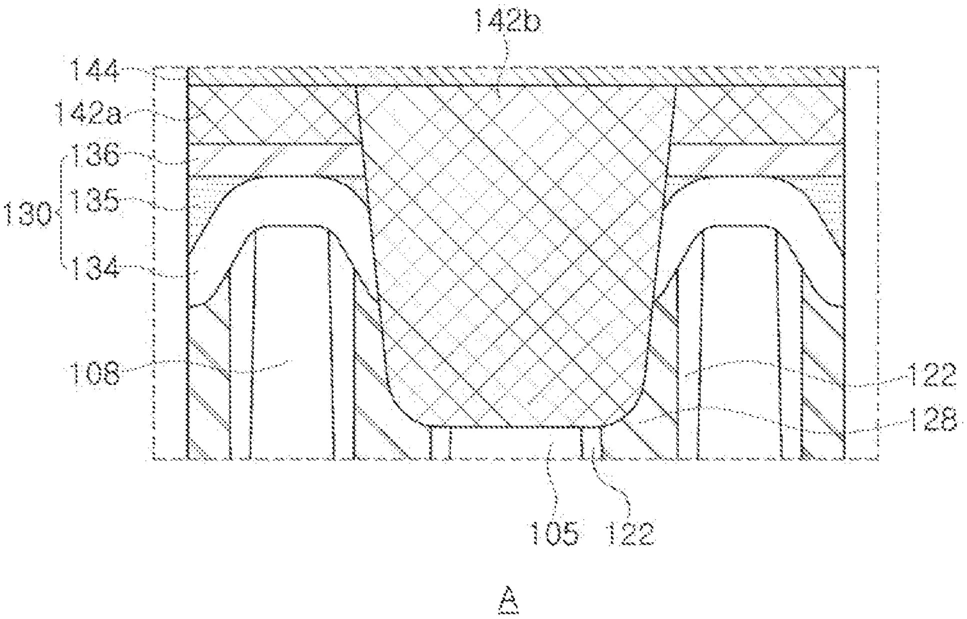
FIGS. 3A and 3B are enlarged diagrams illustrating a semiconductor device, according to an example embodiment of the present disclosure.
Figure 3B:
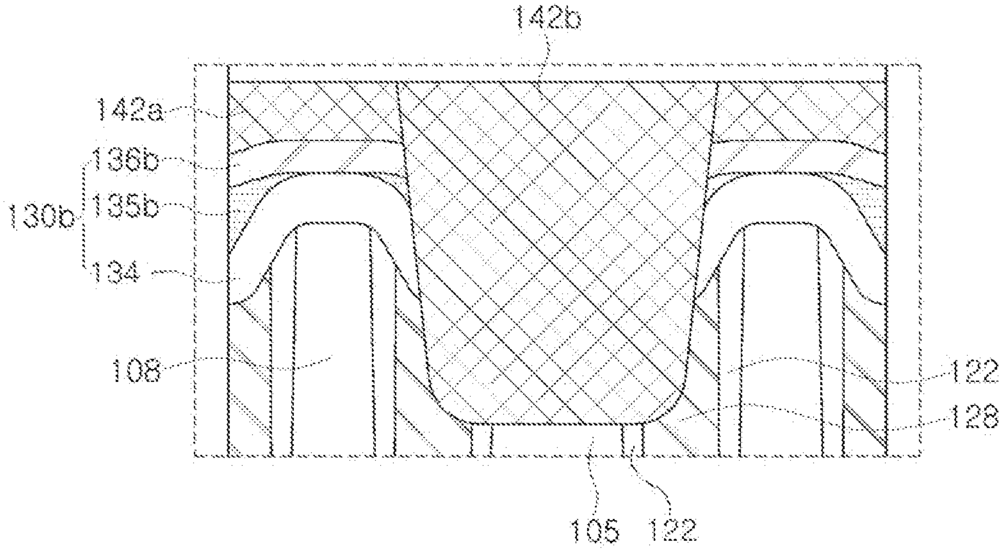

FIGS. 3A and 3B are enlarged diagrams illustrating a portion of a semiconductor device according to an example embodiment, illustrating region "A" in FIG. 2A.

Referring to FIGS. 1 to 3B, a semiconductor device 1 according to example embodiments may include active regions 104 defined by a device isolation region 108 in a substrate 100, buried gate structures 120, a buffer structure 130 covering the active regions 104, device isolation region 108, and the buried gate structures 120, and bit line structures 160 connected to the active regions 104. The semiconductor device 1 may further include storage node contacts 184 disposed between the bit line structures 160 and a capacitor structure 190 in contact with the storage node contacts 184. As used herein, the term "contact" refers to a direct connection (i.e., touching) unless the context indicates otherwise.

The substrate 100 may have an upper surface extending in the x-direction and the y-direction. The substrate 100 may include a semiconductor material, such as, for example, a group IV semiconductor, a group III-V compound semiconductor, or a group II-VI compound semiconductor. For example, the group IV semiconductor may include silicon, germanium, or silicon-germanium. The substrate 100 may be provided as a bulk wafer, an epitaxial layer, an epitaxial layer, a silicon on insulator (SOI) layer, a semiconductor on insulator (SeOI) layer, or the like.

As design rules for the semiconductor device 1 may decrease, the active region 104 may be disposed in the form of an oblique bar as illustrated in FIG. 1. The active regions 104 may be disposed to be inclined at a predetermined angle with respect to the x-direction or the y-direction, and may be repeatedly arranged with the same distance. Due to the inclined arrangement of the active regions 104, cell density per unit region of the substrate 100 may increase while a distance between the active regions 104 adjacent to each other is secured. A center of one of the plurality of active regions 104 may be disposed adjacent to a lower end of the other active region.

The active region 104 may include impurities regions 105 having a predetermined depth from the upper surface of the substrate 100. The impurities regions 105 may be spaced apart from each other. The impurities regions 105 may be provided as source/drain regions of a transistor including word lines. For example, a drain region may be formed between two word lines intersecting the active region 104, and a source region may be formed externally of the two word lines.

The device isolation region 108 may define an active region 104 in the substrate 100. The device isolation region 108 may be formed by, for example, a shallow trench isolation (STI) process. In example embodiments, the device isolation region 108 may include a region extending more deeply into the lower portion of the substrate 100. The device isolation region 108 may be formed of an insulating material. The device isolation region 108 may be, for example, an oxide, a nitride, or a combination thereof.

The buried gate structure 120 may cross the active region 104 and may extend lengthwise in the x-direction. The buried gate structures 120 adjacent to each other may be disposed to cross the active region 104. A plurality of the buried gate structures 120 may extend lengthwise in parallel to each other, and the plurality of gate structures 120 may be disposed in parallel with an equal distance therebetween. The buried gate structure 120 may be disposed in the trench 121 formed in the substrate 100 and may be disposed on a level lower than a level of the upper surface of the substrate 100. For example, the buried gate structure 120 may be formed at least partially below the upper surface of the substrate 100, and the substrate 100 may surround at least a portion of the buried gate structure 120.

The buried gate structure 120 may include a gate insulating layer 122, a lower pattern 124, an upper pattern 126, and a capping pattern 128.

The gate insulating layer 122 may be disposed on a bottom surface and internal side surfaces of the trench 121. The gate insulating layer 122 may conformally cover a bottom surface and an internal side wall of the trench 121. The gate insulating layer 122 may include at least one of silicon oxide, silicon nitride, and silicon oxynitride. In example embodiments, the gate insulating layer 122 may be formed by oxidizing the active region 104 or may be formed by deposition.

The lower pattern 124 and the upper pattern 126 may be provided in a line shape extending in the x-direction and may form a word line. The upper pattern 126 may be provided on the lower pattern 124 and may contact an upper surface of the lower pattern 124. The lower pattern 124 and the upper pattern 126 may be formed of different conductive materials. Each of lower pattern 124 and the upper pattern 126 may be formed of a conductive material, such as, for example, polycrystalline silicon (Si), titanium (Ti), titanium nitride (TiN), tantalum (Ta), tantalum nitride (TaN), tungsten (W), tungsten nitride (WN), and aluminum (Al). For example, the upper pattern 126 may be configured as a semiconductor pattern including polycrystalline silicon doped with P-type or N-type impurities, and the lower pattern 124 may be configured as a metal pattern including at least one of a metal and a metal nitride.

The buried gate structure 120 may further include an insulating liner 125 between the lower pattern 124 and the gate insulating layer 122. The insulating liner 125 may include at least one of silicon oxide, silicon nitride, and silicon oxynitride. Upper surfaces of the insulating liner 125 and the lower pattern 124 may be coplanar with one another. The upper pattern 126 may be provided on the insulating liner 125 and may contact an upper surface of the insulating liner 125.

The capping pattern 128 may be disposed to fill the trench 121 on the upper pattern 126. The capping pattern 128 may contact an upper surface of the upper pattern 126. The capping pattern 128 may be formed of an insulating material, such as, for example, silicon nitride.

Figure 8A:
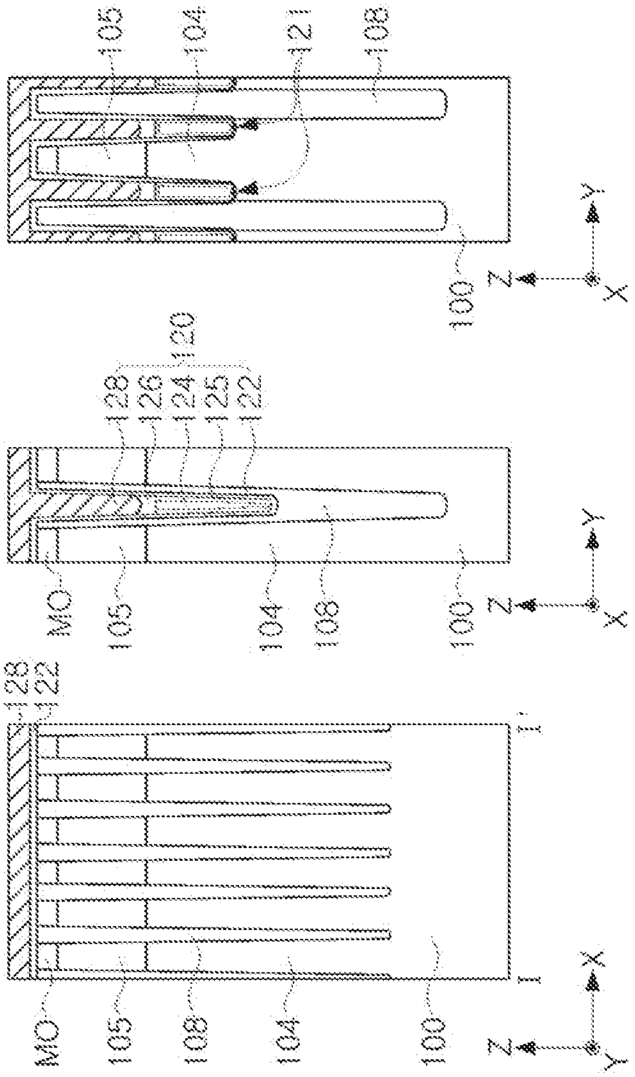
FIGS. 8A to 8E are cross-sectional diagrams illustrating a method of manufacturing a semiconductor device, according to an example embodiment of the present disclosure.
Figure 8B:
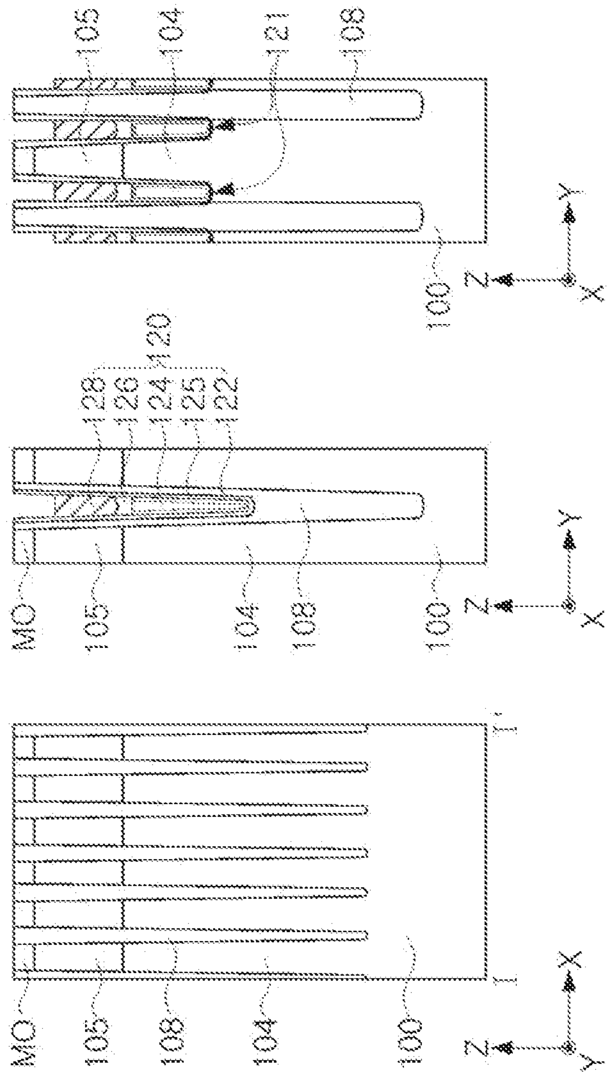
Figure 8C:
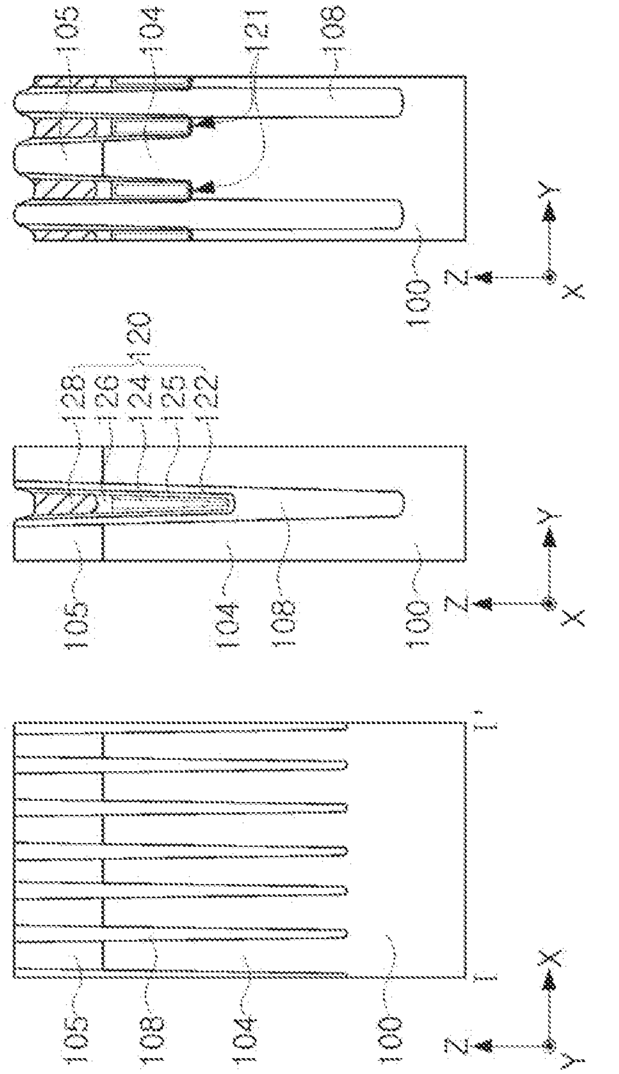

An upper surface of the capping pattern 128 may be disposed on a level lower than a level of upper surfaces of the active regions 104 and the device isolation region 108 (see FIG. 8C). Accordingly, the lower surface of the buffer structure 130 may have, for example, a wavy shape along the profile of the upper surface of the active regions 104, the device isolation region 108, and the buried gate structure 120 (see FIG. 8E).

The buffer structure 130 may include a first buffer pattern 134, a second buffer pattern 135, and a third buffer pattern 136.

The first buffer pattern 134 may be disposed to cover the active regions 104, the device isolation region 108, and the buried gate structure 120 along the profile of the upper surface of the active regions 104, the device isolation region 108, and the buried gate structure 120. For example, the first buffer pattern 134 may contact upper surfaces of the active regions 104, the device isolation region 108, and the buried gate structure 120. The upper surfaces of the active regions 104 and the device isolation region 108 and the upper surfaces of the buried gate structure 120 may be disposed on different levels. Upper surfaces of the active regions 104 and the device isolation region 108 may be disposed on a level higher than a level of an upper surface of the buried gate structure 120. Accordingly, the first buffer pattern 134 disposed along the profile of the upper surface of the active regions 104, the device isolation region 108, and the buried gate structure 120 may have a wavy shape as illustrated in FIGS. 2A, 2B, 3A, and 3B. The shape of the first buffer pattern 134 is not limited thereto, and may vary depending on a distance between the buried gate structures 120, and the level of the upper surface.

The second buffer patterns 135 may be disposed on the upper surface of the first buffer pattern 134. For example, the second buffer patterns 135 may contact the upper surface of the first buffer pattern 134. Differently from the first and third buffer patterns 134 and 136 having a continuous layered structure, the plurality of second buffer patterns 135 may be spaced apart from each other. The second buffer patterns 135 may be disposed to vertically overlap the buried gate structures 120. The second buffer patterns 135 may be disposed on the capping pattern 128 and may extend, for example, in the x-direction. The second buffer patterns 135 may be disposed to fill the concave portion CP of the upper surface of the first buffer pattern 134. The second buffer patterns 135 may be disposed to be spaced apart from each other. In an example embodiment, upper surfaces of the second buffer patterns 135 may have a substantially flat shape on the same level as a level of an uppermost portion of the first buffer patterns 134 (see buffer structure 130 of FIG. 3A). In another example embodiment, the upper surface of the second buffer pattern 135*b* may have a curved shape (see buffer structure 130*b* of FIG. 3B). For example, the upper surface of the second buffer pattern 135*b* may have a relatively low level on the concave portion CP of the first buffer pattern 134 according to the shape profile of the first buffer pattern 134. The shape of the second buffer patterns 135 is not limited thereto, and may vary depending on the shape and thickness of the first buffer pattern 134.

The third buffer pattern 136 may be disposed on the first and second buffer patterns 134 and 135. For example, the third buffer pattern 136 may contact upper surfaces of the first and second buffer patterns 134 and 135. The third buffer pattern 136 may be formed along the profile of the upper surface of the first and second buffer patterns 134 and 135. For example, the third buffer pattern 136 may have a substantially planar shape (see buffer structure 130 of FIG. 3A), or the third buffer pattern 136*b* may have a curved shape (see buffer structure 130*b* of FIG. 3B). The thickness of the third buffer pattern 136 may be less than the thickness of the first and second buffer patterns 134 and 135. However, the thickness of the third buffer pattern 136 is not limited thereto, and may be substantially the same as or greater than the thickness of the first and second buffer patterns 134 and 135. Herein, unless the context indicates otherwise, the term "thickness" refers to the thickness or height measured in a direction perpendicular to a top surface of the substrate 100.

The first to third buffer patterns 134, 135, and 136 may include silicon oxide or silicon nitride. In an example embodiment, the first and third buffer patterns 134 and 136 may include silicon oxide, and the second buffer patterns 135 may include silicon nitride.

The buffer structure 130 may include a first region in which the first buffer pattern 134 and the third buffer pattern 136 are stacked, and a second region in which first to third buffer patterns 134, 135, and 136 are stacked in sequence. For example, in the first region, the second buffer pattern 135 may not be interposed between the first and third buffer patterns 134 and 136. The first region of the buffer structure 130 may be disposed on the active region 104 and the device isolation region 108, and the second region of the buffer structure 130 may be disposed on the buried gate structure 120. In an example embodiment, two oxide layers may be stacked on the active region 104 and the device isolation region 108, and an oxide layer, a nitride layer, and an oxide layer may be stacked on the buried gate structure 120 in sequence. In the first region, the buffer structure 130 may have a first thickness, and in the second region, the buffer structure 130 may have a second thickness greater than the first thickness.

As the first to third buffer patterns 134, 135, and 136 include the above-described structure and material, distribution of the recesses of the storage node contact 184 may improve, which will be described in greater detail with reference to FIG. 9B in the manufacturing process later.

The bit line structure 160 may extend lengthwise in the y-direction on the active regions 104 and may be connected to the plurality of active regions 104. The bit line structure 160 may extend lengthwise in a direction perpendicular to the buried gate structure 120.

The bit line structure 160 may include a bit line BL and a bit line capping pattern BLC. The bit line BL may include a first portion in which a first conductive pattern 142*a*, a third conductive pattern 144, and a fourth conductive pattern 146 are stacked in sequence, and a second portion in which a second conductive pattern 142*b*, a third conductive pattern 144, and a fourth conductive pattern 146 are stacked in sequence. In example embodiments, the first conductive pattern 142*a* and the second conductive pattern 142*b* may horizontally overlap one another. The bit line capping pattern BLC may be disposed on the fourth conductive pattern 146. For example, the bit line capping pattern BLC may contact an upper surface of the fourth conductive pattern 146.

The first conductive pattern 142*a* may be disposed on the third buffer pattern 136 of the buffer structure 130, and may contact an upper surface of the third buffer pattern 136. The second conductive pattern 142*b* may be disposed on the active region 104 and may be in contact the active region 104. The bit line BL may be electrically connected to the active region 104 through the second conductive pattern 142*b*. The second conductive pattern 142*b* may form a bit line contact pattern. The lower surface of the second conductive pattern 142*b* may be disposed on a level lower than a level of the upper surface of the substrate 100, and may be disposed on a level higher than a level of the upper surface of the word line. In an example embodiment, the second conductive pattern 142*b* may be formed in the substrate 100 and may be locally disposed in the bit line contact hole CH exposing the active region 104.

The first and second conductive patterns 142*a* and 142*b* may include a semiconductor material such as polycrystalline silicon. The third conductive pattern 144 may include a metal-semiconductor compound. The metal-semiconductor compound may be obtained by, for example, silicidating a portion of the first and second conductive patterns 142*a* and 142*b*. For example, the metal-semiconductor compound may include cobalt silicide (CoSi), titanium silicide (TiSi), nickel silicide (NiSi), tungsten silicide (WSi), or other metal silicides. The fourth conductive pattern 146 may include a metal material such as titanium (Ti), tantalum (Ta), tungsten (W), and aluminum (Al). The number of conductive patterns included in the bit line BL, the type of material, and/or the stacking order may vary in example embodiments.

The bit line capping pattern BC may include a first capping pattern 161, a second capping pattern 162, and a third capping pattern 163 stacked in sequence on the fourth conductive pattern 146. Each of the first to third capping patterns 161, 162, and 163 may include an insulating material, such as, for example, a silicon nitride layer. The first to third capping patterns 161, 162, and 163 may be formed of different materials, and even when the first to third capping patterns 161, 162, and 163 include the same material, boundaries therebetween may be distinct by differences in physical properties. A thickness of the second capping pattern 162 may be smaller than each of a thickness of the first capping pattern 161 and a thickness of the third capping pattern 163. The number of capping patterns and/or the type of material included in the bit line capping pattern BC may vary in the example embodiments.

The spacer structure 170 may be disposed on both sidewalls of each of the bit line structures 160 and may extend lengthwise in the y-direction. The spacer structure 170 may be disposed between the bit line structure 160 and the storage node contact 184. The spacer structure 170 may be disposed to extend along sidewalls of the bit line BL and sidewalls of the bit line capping pattern BLC. A pair of spacer structures 170 disposed on both sides of the bit line structure 160 may have an asymmetric shape with respect to the bit line structure 160.

Each of the spacer structure 170 may include a plurality of spacer layers. In an example embodiment, the spacer structure 170 may include a first spacer 170*a* covering sidewalls and an upper surface of the bit line structure 160, a second spacer 170*b* filling at least a portion of the bit line contact hole CH, and third and fourth spacers 170*c* and 170*d* covering a sidewall of the bit line structure 160 and stacked in sequence on the first spacer 170*a*. For example, the first spacer 170*a* may contact sidewalls and the upper surface of the bit line structure 160, the second spacer 170*b* may contact sidewalls of the first spacer 170*a*, the third spacer 170*c* may contact sidewalls of the second spacer 170*b*, and the fourth spacer 170*d* may contact sidewalls of the third spacer 170*c*. However, the number and shape of the spacers included in the spacer structure 170 is not limited thereto. For example, in the example embodiments, the spacer structure 170 may further include an air spacer.

The storage node contact 184 may be connected to the active region 104. The storage node contact 184 may be disposed between the bit line structures 160 and between the buried gate structures 120. The storage node contact 184 may contact the bit line structures 160 and the buried gate structures 120. The storage node contact 184 may penetrate through the buffer structure 130 and may be connected to the active region 104. The storage node contact 184 may be in direct contact with the active region 104.

The lower surface of the storage node contact 184 may be disposed on a level lower than a level of the upper surface of the substrate 100, and the upper surface of the storage node contact 184 may be disposed on a level higher than a level of the upper surface of the bit line structures 160. The storage node contact 184 may be insulated from the second conductive pattern 142*b* by the spacer structure 170.

The storage node contact 184 may include a plurality of layers. For example, the storage node contact 184 may be formed by stacking a lower conductive pattern, a metal-semiconductor compound layer, and an upper conductive pattern in sequence.

The lower conductive pattern and the upper conductive pattern may be formed of a conductive material, and may include, for example, at least one of polycrystalline silicon (Si), titanium (Ti), titanium nitride (TiN), tantalum (Ta), tantalum nitride (TaN), tungsten (W), tungsten nitride (WN), and aluminum (Al).

The metal-semiconductor compound layer may be disposed between the upper conductive pattern and the lower conductive pattern. The metal-semiconductor compound layer may be obtained by, for example, siliciding a portion of the lower conductive pattern when the lower conductive pattern includes a semiconductor material. The metal-semiconductor compound layer may include, for example, cobalt silicide (CoSi), titanium silicide (TiSi), nickel silicide (NiSi), tungsten silicide (WSi), or other metal silicide. In example embodiments, the metal-semiconductor compound layer may not be provided.

An upper insulating pattern 186 may be disposed between the storage node contacts 184 and may isolate storage node contacts 184 adjacent to each other. The upper insulating pattern 186 may include an insulating material, such as, for example, at least one of silicon oxide, silicon nitride, and silicon oxynitride.

The semiconductor device 1 may further include fence insulating patterns 180. The fence insulating patterns 180 may be disposed between the storage node contacts 184. The fence insulating patterns 180 may be recessed into a portion of the buffer structure 130. As an example embodiment, referring to FIG. 2A, the fence insulation patterns 180 may penetrate the second and third buffer patterns 135 and 136 of the buffer structure 130, and may be in contact with the first buffer pattern 134. In another example embodiment, referring to FIG. 2B, the fence insulating patterns 180*a* may penetrate the third buffer pattern 136 of the buffer structure 130*a* and may be in contact with the second buffer pattern 135. The fence insulating patterns 180 may isolate storage node contacts 184 adjacent to each other. The fence insulating patterns 180 may include an insulating material, such as, for example, at least one of silicon oxide, silicon nitride, and silicon oxynitride.

The capacitor structure 190 may include a lower electrode 190*a*, a capacitor dielectric layer 190*b*, and an upper electrode 190*c*. The capacitor structure 190 may store electric charges in the capacitor dielectric layer 190*b* using a potential difference generated between the lower electrode 190*a* and the upper electrode 190*c*. The capacitor structure 190 may be connected to the storage node contact 184 and may be electrically connected to the active region 104.

FIGS. 4 to 7 are enlarged cross-sectional diagrams illustrating a semiconductor device according to example embodiments, illustrating regions corresponding to FIG. 3B.

In the example embodiments in FIGS. 4 to 7, the same reference numerals as in FIGS. 1 to 3B may indicate the corresponding component, and the overlapping descriptions will not be provided. In the example embodiments in FIGS. 4 to 7, the component may have the same reference numerals as those in FIGS. 1 to 3B and may have a different alphabet letter, which may be to describe an example embodiment different from those of FIGS. 1 to 3B, and the descriptions of the components having the same reference numerals may be substantially the same.

The structure of the buffer structure in the example embodiments in FIGS. 4 to 7 may be different from the example embodiments in FIGS. 1 to 3B.

Figure 4:
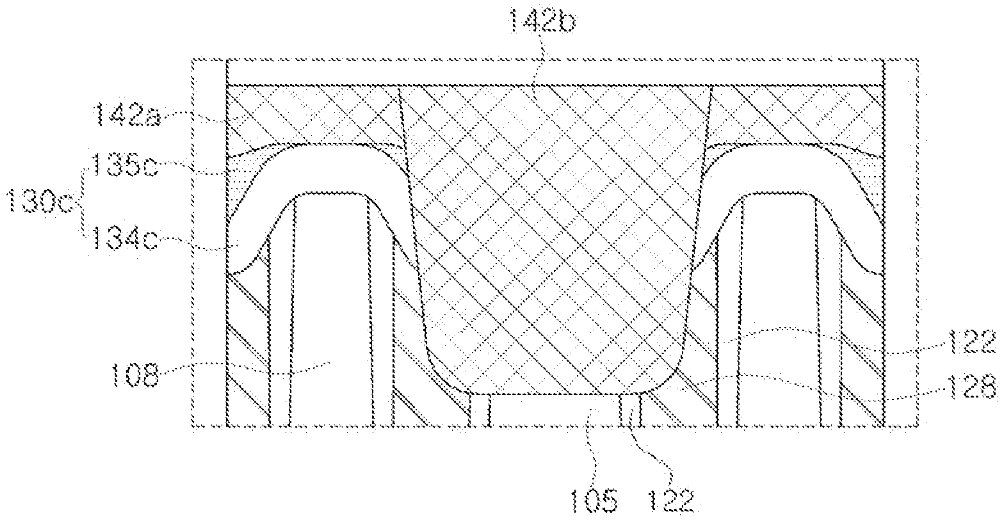
FIG. 4 is an enlarged diagram illustrating a semiconductor device, according to an example embodiment of the present disclosure.

Referring to FIG. 4, the buffer structure 130*c* may include a first buffer pattern 134*c* and second buffer patterns 135*c*. The buffer structure 130*c* may be different from the example embodiments in FIG. 3B in that the buffer structure 130*c* does not include the third buffer pattern. For example, the first conductive pattern 142*a* may contact an upper surface of the second buffer patterns 135*c*. The first buffer pattern 134*c* may be disposed to cover the upper surface of the active region 104, the device isolation region 108, and the buried gate structure (e.g., buried gate structure 120 in FIG. 2A) along the profile of the upper surface. The second buffer patterns 135*c* may be disposed to cover the concave portion of the upper surface along the upper surface profile of the first buffer pattern 134*c*. The plurality of second buffer patterns 135*c* may be spaced apart from each other.

Figure 5:
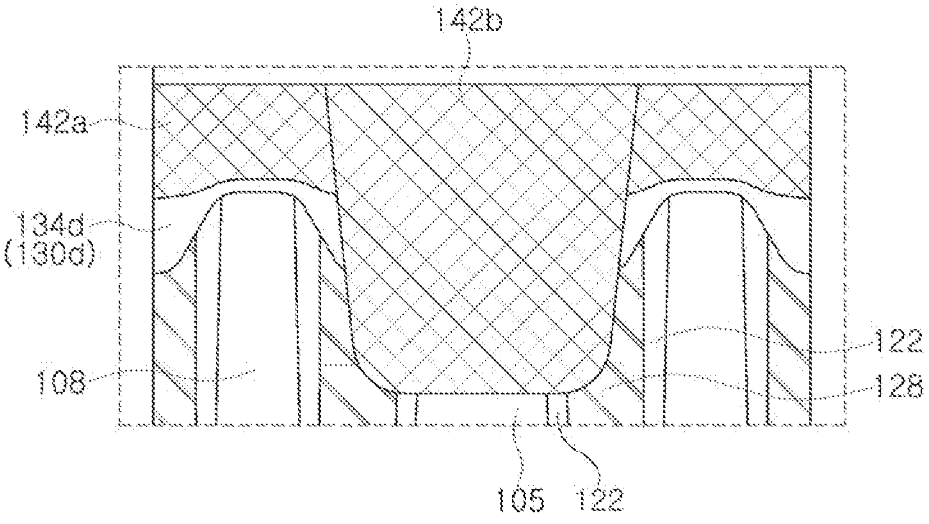
FIG. 5 is an enlarged diagram illustrating a semiconductor device, according to an example embodiment of the present disclosure.

Referring to FIG. 5, the buffer structure 130*d* may include a first buffer pattern 134*d*. The buffer structure 130*d* may be different from the example embodiments in FIG. 3B in that the buffer structure 130*d* may include a single layer of the first buffer pattern 134*d*. For example, the first conductive pattern 142*a* may contact an upper surface of the first buffer patterns 134*d*. The first buffer pattern 134*d* may be disposed to cover the upper surface of the active region 104, the device isolation region 108, and the buried gate structure (e.g., buried gate structure 120 in FIG. 2A) along the profile of the upper surface. The first buffer patterns 134*b* in FIG. 3B may have substantially the same thickness, whereas, in the example embodiments in FIG. 5, the first buffer pattern 134*d* may have a non-uniform thickness. In an example embodiment, the first buffer pattern 134*d* may have a minimum thickness on the device isolation region 108 and may have a maximum thickness on the capping pattern 128 of the buried gate structure 120 (e.g., FIG. 2A).

In FIGS. 4 and 5, the example embodiment in which the upper surface of the buffer structures 130*c* and 130*d* has a curved shape is illustrated, but an example embodiment thereof is not limited thereto. In FIGS. 4 and 5, the upper surface of the buffer structure may also have a substantially planar shape, such as disclosed in FIG. 3A.

Figure 6:
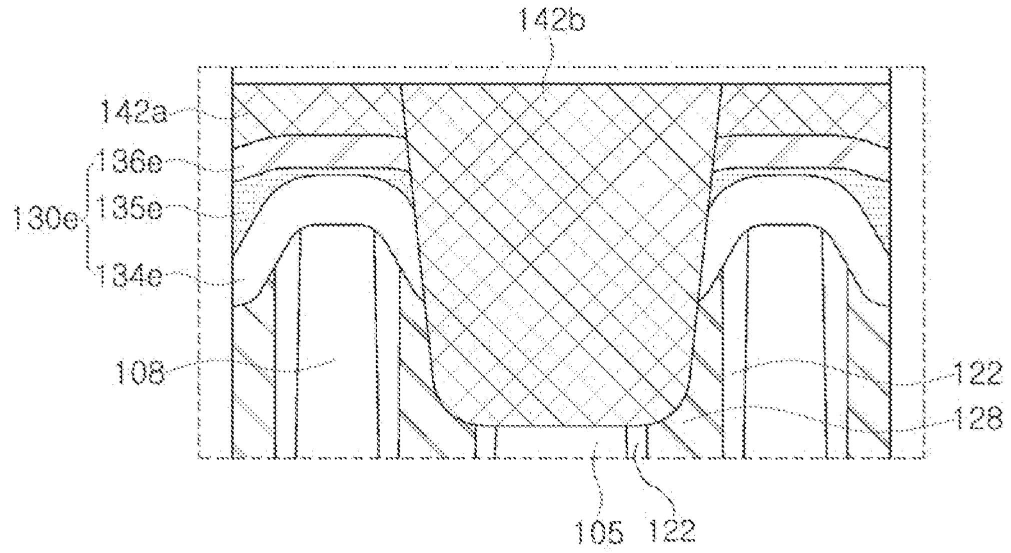
FIG. 6 is an enlarged diagram illustrating a semiconductor device, according to an example embodiment of the present disclosure.

Referring to FIG. 6, the second buffer pattern 135*e* may have a continuous layered structure. The second buffer pattern 135*e* may be continuously disposed on the device isolation region 108 and the capping pattern 128 of the buried gate structure 120 (e.g., FIG. 2A). The example embodiments in FIG. 6 may be substantially the same as the example embodiments in FIG. 3B, other than the configuration in which the second buffer pattern 135*e* may include a portion disposed on the device isolation region 108. The second buffer pattern 135*e* may include first portions filling the concave portions of the first buffer pattern 134*e*, and second portions disposed on the first buffer pattern 134*e* and connecting the first portions to each other. The second portions may be disposed on the first buffer pattern 134*e* disposed on the active regions 104 (in FIG. 2A) and the device isolation region 108. A thickness of the second portion of the second buffer pattern 135*e* may be smaller than a thickness of the first portion of the second buffer pattern 135*e*.

In FIG. 6, a modified structure of the second buffer pattern 135*e* described in the example embodiments with reference to FIG. 3B is illustrated, but an example embodiment thereof is not limited thereto. In the example embodiments in FIG. 3A, a portion of the second buffer pattern 135 may remain on the device isolation region 108.

Figure 7:
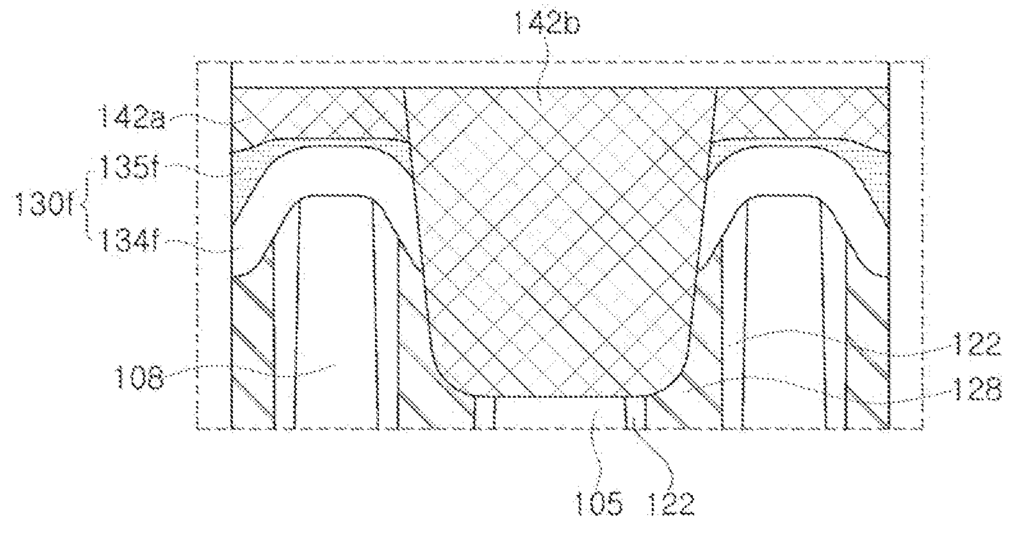
FIG. 7 is an enlarged diagram illustrating a semiconductor device, according to an example embodiment of the present disclosure.

Referring to FIG. 7, the second buffer pattern 135*f* may have a continuous layered structure. The second buffer pattern 135*f* may be continuously disposed on the device isolation region 108 and the capping pattern 128 of the buried gate structure 120 (e.g., FIG. 2A). The example embodiments in FIG. 7 may be substantially the same as the example embodiments in FIG. 4, other than the configuration in which the second buffer pattern 135*f* may include a portion disposed on the device isolation region 108. The second buffer pattern 135*f* may include first portions filling the concave portions of the first buffer pattern 134*f*, and second portions disposed on the first buffer pattern 134*f* and connecting the first portions to each other. The second portions may be disposed on the first buffer pattern 134*f* disposed on the active regions 104 (in FIG. 2A) and the device isolation region 108. A thickness of the second portion of the second buffer pattern 135*f* may be smaller than a thickness of the first portion of the second buffer pattern 135*f*.

Referring to FIGS. 3A to 7 along with FIGS. 2A and 2B, the bit line contact hole CH in which the second conductive pattern 142*b* of the bit line BL is disposed may hardly be in contact with the second buffer patterns 135, 135*b*, 135*c*, 135*e*, and 135*f* including nitride in the x-direction and in the y-direction.

Referring to the cross-sectional diagrams taken long line I-I' in FIGS. 2A and 2B, the second conductive pattern 142*b* may be disposed on the active region 104 in the bit line contact hole CH. The buffer structure adjacent to the bit line contact hole CH in the x-direction may include a first buffer pattern 134 and a third buffer pattern 136 including an oxide. The buffer structure adjacent to the bit line contact hole CH in the x direction may not include the second buffer pattern 135 including nitride between the first and third buffer patterns 134 and 136. The second buffer pattern 135 may not be disposed on the active region 104 and the device isolation region 108, and may be disposed only on the capping pattern 128 of the buried gate structures 120. Since the bit line contact hole CH is formed in the active region 104 and the device isolation region 108 disposed between the buried gate structures 120 adjacent to each other, the second conductive pattern 142*b* may not be adjacent to the second buffer pattern 135 including nitride in the x-direction.

Referring to the cross-sectional diagrams taken along lines III-III' in FIGS. 2A and 2B and FIGS. 3A to 7, the second conductive pattern 142*b* may include a portion filling the bit line contact hole CH in the y-direction. The region in which the second conductive pattern 142*b* in contact with the second buffer pattern 135 including nitride may be smaller than the region in contact with the first and third buffer patterns 134 and 136 including oxide. In an example embodiment, the second conductive pattern 142*b* may not be substantially in contact with the second buffer pattern 135 in the y-direction.

As described above, the bit line contact hole CH in which the second conductive pattern 142*b* is disposed may not be substantially in contact with the second buffer pattern 135 including nitride in the x-direction and the y-direction, or may be in contact with the second buffer pattern 135 in an area narrower than the first and third buffer patterns 134 and 136 including oxide. As the second conductive pattern 142*b* and the adjacent buffer structure 130 have the above-described structure, distribution of the lower recesses of the storage node contact 184 may improve.

The improvement of recess distribution may be described with reference to a process of manufacturing the second conductive pattern 142*b*, which will be described later. The second conductive pattern 142*b* may be formed by filling the entire bit line contact hole CH with polysilicon (see FIG. 9A) and etching the portions other than the portion disposed on the active region 104 (see FIG. 9B). Depending on conditions of etching polycrystalline silicon, nitride may be etched together, but oxide may not be etched. Accordingly, when the buffer structure adjacent to the bit line contact hole CH includes the second buffer pattern 135 including nitride, by a polysilicon etching process for forming the second conductive pattern 142*b*, the second buffer pattern 135 may be etched together, and the buffer structure may collapse.

In the semiconductor device 1 in the example embodiments, the bit line contact hole CH may not be substantially in contact with the second buffer pattern 135 including nitride or may be in contact only with the second buffer pattern 135 in a small area. The bit line contact hole CH may be in contact with the first and third buffer patterns 134 and 136 including oxide in most of the regions. Accordingly, collapse of the buffer structure caused by the etching process of polysilicon formed in the bit line contact hole CH may not occur.

FIGS. 8A to 8E and 9A to 9F are cross-sectional diagrams illustrating a method of manufacturing a semiconductor device according to an example embodiment.

FIGS. 8A to 8E illustrate processes until the buffer structure 130 is formed, and FIGS. 9A to 9F illustrate a process of forming the bit line structure 160 and the storage node contact 184.

Referring to FIG. 8A, the mask layer MO may be formed on the substrate 100, the device isolation region 108 may be formed on the substrate 100, thereby defining the active region 104. A device isolation trench may be formed in the substrate 100, and the device isolation region 108 may fill the device isolation trench. On a plane, the active region 104 may be configured in the form of an elongated bar inclined at a predetermined angle with respect to the x-direction or the y-direction. Impurities regions 105 may be formed on the active region 104 by performing an ion implantation process using the device isolation region 108 as an ion implantation mask.

The trench 121 may be formed by patterning the active region 104 and the device isolation region 108. Two adjacent trenches 121 may cross the active region 104, but an example embodiment thereof is not limited thereto.

The gate insulating layer 122 may be formed to have a substantially conformal thickness on the internal side surface of the trench 121, an upper surface of the mask layer MO, and an upper surface of the device isolation region 108. The term "thickness," when referring to a thickness of the gate insulating layer 122 formed on the internal side surface of the trench 121, refers to a thickness perpendicular to the internal side surface of the trench 121. Subsequently, the lower pattern 124 and the upper pattern 126 may be formed to fill the trench 121. A word line may be formed by partially etching an upper portion of the upper pattern 126. An upper surface of the word line may be recessed to be disposed on a level lower than a level of an upper surface of the active region 104. Subsequently, a capping pattern 128 may be stacked on the active regions 104 and the device isolation region 108. The capping pattern 128 may be formed to fill the trench 121 and to cover upper surfaces of the active regions 104 and the device isolation region 108. In example embodiments, after forming the gate insulating layer 122 and before forming the lower pattern 124, an insulating liner 125 may be additionally formed on the gate insulating layer 122.

Referring to FIG. 8B, the capping pattern 128 may be etched. The capping pattern 128 formed to a level higher than a level of the upper surface of the active regions 104 and the device isolation region 108 may be etched to a level lower than a level of the upper surface of the active region 104. Also, the gate insulating layer 122 formed on the upper surface of the mask layer MO and the upper surface of the device isolation region 108 may be etched.

Referring to FIG. 8C, the mask layer MO may be etched. The mask layer MO may be removed by etching such that the upper surfaces of the active region 104 and the device isolation region 108 may be exposed. The upper surfaces of the active region 104 and the device isolation region 108 may be disposed on a level higher than a level of that of the capping pattern 128.

Along with the etching of the mask layer MO, an upper portion of the gate insulating layer 122 formed on the internal side surface of the trench 121 may be partially etched. Accordingly, the gate insulating layer 122 may have a shape in which the thickness gradually decreases on an upper portion of the trench 121.

Figure 8D:
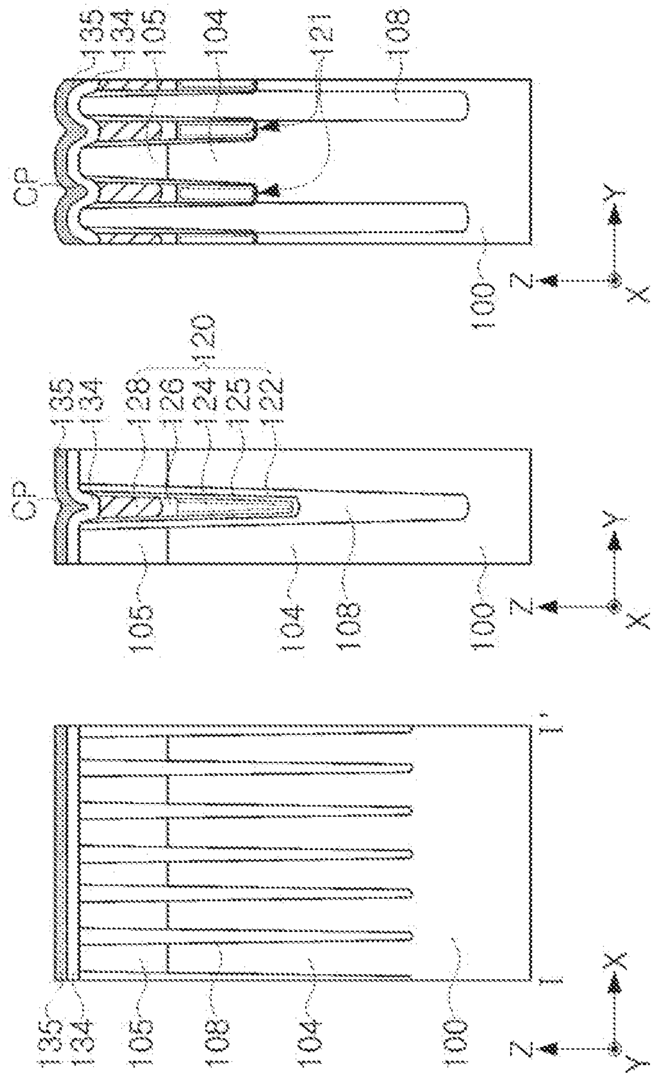

Referring to FIG. 8D, a first buffer pattern 134 and a second buffer pattern 135 may be stacked in sequence on the active regions 104 and the device isolation region 108. The first and second buffer patterns 134 and 135 may be formed along profile of the upper surfaces of the active regions 104 and the device isolation region 108. As described above with reference to FIG. 8C, the upper surfaces of the active region 104 and the device isolation region 108 may be disposed on a level higher than a level of that of the capping pattern 128. The first buffer pattern 134 may be formed in a shape corresponding to a profile according to a level difference between the components. An upper surface of the first buffer pattern 134 may include a concave portion CP. The second buffer patterns 135 may be formed in a shape corresponding to the profile of the first buffer pattern 134. The first buffer patterns 134 may include silicon oxide, and the second buffer patterns 135 may form silicon nitride.

Figure 8E:
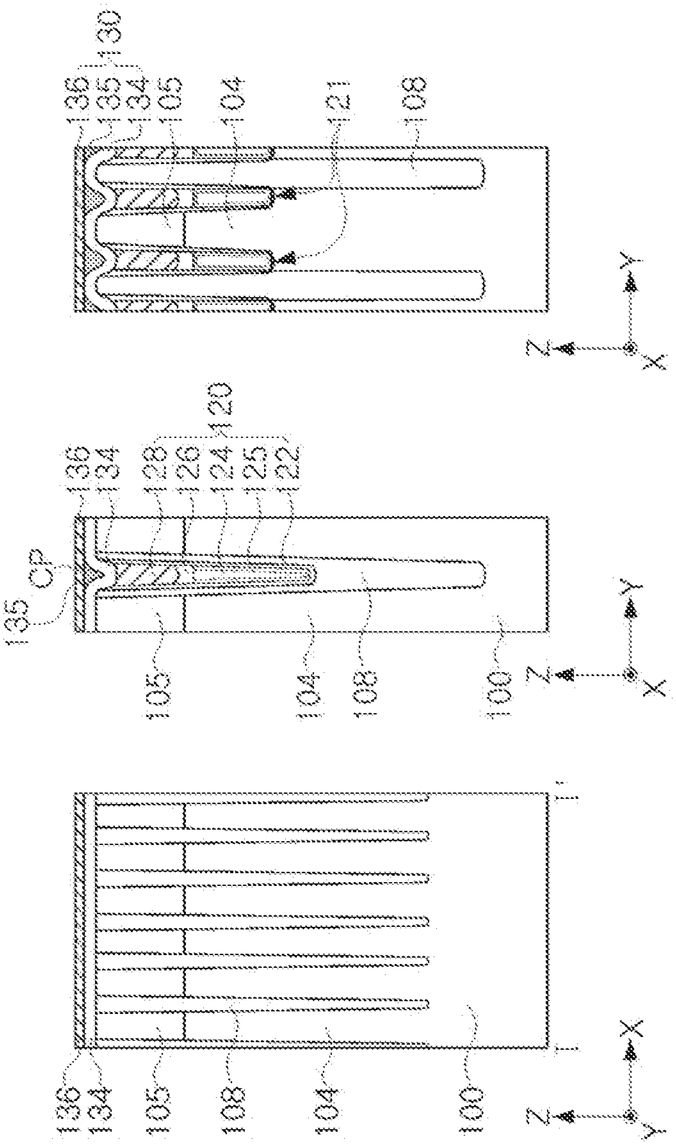

Referring to FIG. 8E, the second buffer patterns 135 may be planarized. For example, chemical mechanical polishing (CMP) may be performed on the second buffer patterns 135. In an example embodiment, the second buffer patterns 135 formed on a level higher than a level of an uppermost portion of the first buffer pattern 134 may be removed, and the second buffer patterns 135 may remain only in the concave portion CP of the upper surface of the first buffer pattern 134. The second buffer patterns 135 may be spaced apart from each other. However, the shape of the second buffer pattern 135 is not limited thereto. In another example embodiment, the second buffer pattern 135 may include portions disposed on the active regions 104 and the device isolation region 108. Accordingly, the second buffer pattern 135 may have the same shape as in FIG. 6 or FIG. 7 described above.

The upper surface of the first buffer pattern 134 and the upper surface of the second buffer patterns 135 may be substantially coplanar with each other, but an example embodiment thereof is not limited thereto. In example embodiments, the upper surfaces of the second buffer patterns 135 may have a relatively low level on the concave portion CP of the first buffer pattern 134, and may have a shape similar to that in FIG. 3B.

Subsequently, a third buffer pattern 136 may be formed on the first and second buffer patterns 134 and 135. The third buffer pattern 136 may include silicon oxide. In an example embodiment, the third buffer pattern 136 may have a thickness smaller than that of the first and second buffer patterns 134 and 135, but the thickness of the third buffer pattern 136 is not limited thereto.

The buffer structure 130 including the first to third buffer patterns 134, 135, and 136 may be formed on the device isolation region 108 and the active regions 104 by the process in FIGS. 8A to 8E. The first buffer pattern 134 may have a concave portion CP on the buried gate structure 120, and the second buffer patterns 135 may be formed to fill the concave portion CP of the first buffer pattern 134. Accordingly, the second buffer patterns 135 may be formed only on the buried gate structure 120 and may not be formed on the active region 104 and the device isolation region 108. The first and third buffer patterns 134 and 136 may include silicon oxide, and the second buffer patterns 135 may include silicon nitride. The second buffer patterns 135 including silicon nitride may be formed only on the buried gate structure 120.

In the example embodiments illustrated in FIGS. 8D and 8E, the buffer structure 130 may include first to third buffer patterns 134, 135, and 136, but an example embodiment thereof is not limited thereto.

In an example embodiment, after the second buffer patterns 135 are planarized in the process in FIG. 8E, the process of forming the third buffer patterns 136 may not be performed. In this case, the buffer structure 130 may include the first and second buffer patterns 134 and 135, and the semiconductor device illustrated in FIG. 4 may be manufactured.

In another example embodiment, the buffer structure 130 may be formed by forming the first buffer pattern 134 and planarizing the first buffer pattern 134 in the process in FIG. 8D. For example, the process of forming the second and third buffer patterns 135 and 136 may not be performed. In this case, the buffer structure 130 may be formed as a single layer of the first buffer pattern 134, such that the semiconductor device illustrated in FIG. 5 may be manufactured.

In the description below, referring to FIG. 9A, a first conductive pattern 142*a* may be formed on the third buffer pattern 136. A mask pattern (not illustrated) may be formed on the first conductive pattern 142*a*, and an etching process using the mask pattern as an etching mask may be performed. The bit line contact hole CH exposing the upper portion of the active region 104 by etching a portion of the first conductive pattern 142*a* and the first to third buffer patterns 134, 135, and 136 may be formed through an etching process.

A second conductive pattern 142*b* may be formed to fill the bit line contact hole CH. In example embodiments, a preliminary second conductive pattern (not illustrated) filling the bit line contact hole CH may be formed, and an upper portion of the preliminary second conductive pattern may be etched back. The second conductive pattern 142*b* may have an upper surface disposed on substantially the same level as a level of the upper surface of the first conductive pattern 142*a*.

The first and second conductive patterns 142*a* and 142*b* may include, for example, polycrystalline silicon doped with impurities. The first and second conductive patterns 142*a* and 142*b* may be merged with each other.

Thereafter, the etching mask may be removed, and the third conductive pattern 144, the fourth conductive pattern 146, the first capping pattern 161, the second capping pattern 162 and the third capping pattern 163 may be sequentially formed on the first and second conductive patterns 142*a* and 142*b*.

The first and second conductive patterns 142*a* and 142*b* may include a semiconductor material such as polycrystalline silicon. The third conductive pattern 142*c* may include a metal-semiconductor compound. The fourth conductive pattern 142*d* may include a metal material such as titanium (Ti), tantalum (Ta), tungsten (W), and aluminum (Al). The number of conductive patterns included in the bit line BL, the type of material, and/or the stacking order may vary in example embodiments.

Each of the first to third capping patterns 161, 162, and 163 may include an insulating material, such as, for example, a silicon nitride layer. The first to third capping patterns 161, 162, and 163 may be formed of different materials, and even when the first to third capping patterns 161, 162, and 163 include the same material, boundaries may be distinct by differences in physical properties. The number of capping patterns and/or the type of material included in the bit line capping pattern BLC may vary in the example embodiments.

Figure 9A:
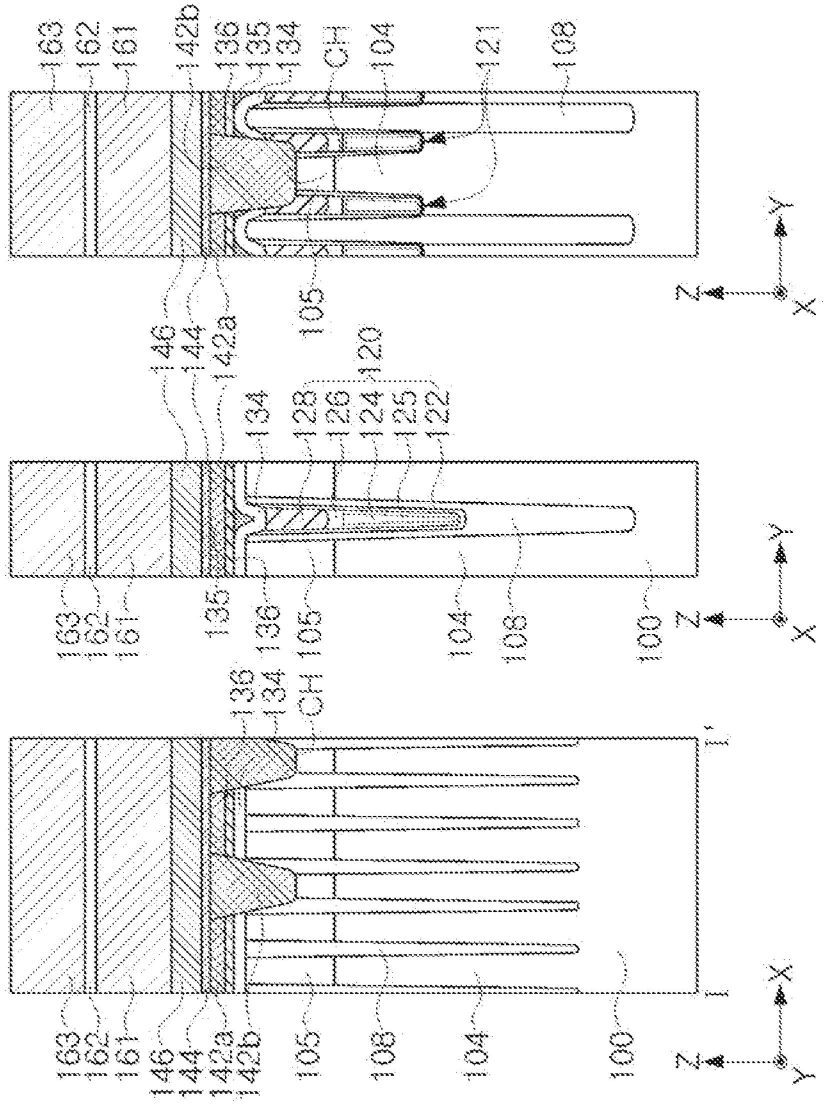
FIGS. 9A to 9F are cross-sectional diagrams illustrating a method of manufacturing a semiconductor device, according to an example embodiment of the present disclosure.

As illustrated in FIG. 9A, the second conductive pattern 142*b* filling the bit line contact hole CH may not be substantially in contact with the second buffer patterns 135 including nitride in the x-direction and the y-direction. The second conductive pattern 142*b* may be in contact with the first and third buffer patterns 134 and 136 including oxide in most of the regions. Accordingly, in the subsequent process of etching the second conductive pattern 142*b* in FIG. 9B, the buffer structure adjacent to the bit line contact hole CH may not be damaged.

Figure 9B:
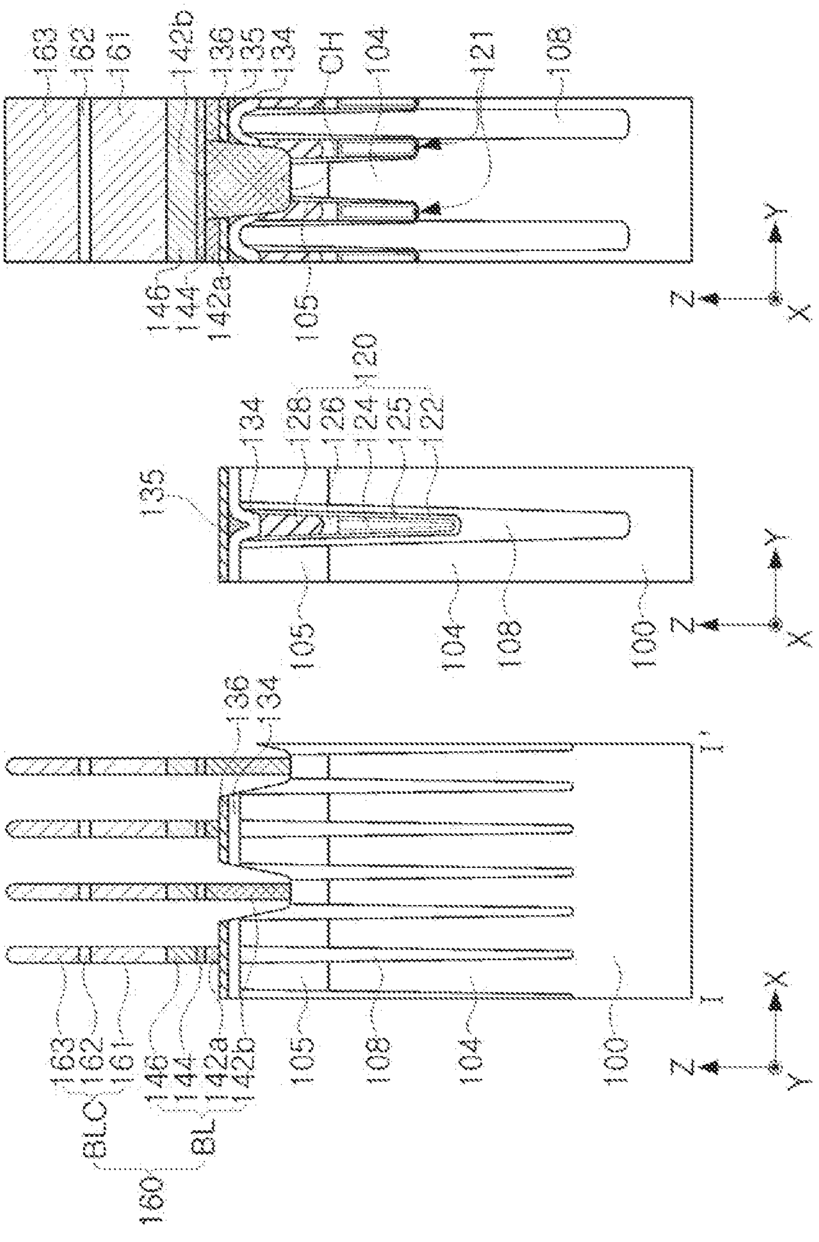

Referring to FIG. 9B, the third capping pattern 163 may be etched, and the second capping pattern 162, the first capping pattern 161, the fourth conductive pattern 146, the third conductive pattern 144 and the first and second conductive patterns 142*a* and 142*b* may be etched in sequence using the third capping pattern 163 as a mask. Accordingly, the bit line capping pattern BLC including the first to third capping patterns 161, 162, and 163 and the bit line BL including the first to fourth conductive patterns 142*a*, 142*b*, 144 and 146 may be formed.

In the etching process for forming the bit line BL, the second conductive pattern 142*b* may be formed by etching a semiconductor material such as polysilicon in the bit line contact hole CH. When polysilicon is etched, the buffer structure 130 adjacent to the bit line contact hole CH may be damaged. In this case, the buffer structure 130 may collapse in a region adjacent to the bit line contact hole CH. Since the storage node contact hole formed in the process in FIG. 9E may be formed by etching the buffer structure 130 adjacent to the bit line contact hole CH, collapse of the buffer structure 130 may deteriorate distribution of recesses in the storage node contact hole.

Since the buffer structure 130 in the example embodiments does not include silicon nitride on the active region 104 and the device isolation region 108, the above-described issue may be addressed. In the process of etching polycrystalline silicon, silicon nitride may be likely to be etched together with polycrystalline silicon, whereas silicon oxide may be hardly affected by the etching of polycrystalline silicon. For example, the buffer structure 130 between the adjacent bit line contact holes CH may be formed to include only the silicon oxide layer, such that even when polysilicon is etched in the process of forming the bit line BL, the buffer structure 130 may not collapse. Accordingly, distribution of the recesses of the storage node contact holes for forming the storage node contact 184 formed in a process described later may improve.

The bit line structure 160 including the bit line capping pattern BLC and the bit line BL may extend lengthwise, for example, in the y direction and a plurality of the bit line capping pattern BLC and the bit line BL may be formed in the x direction. The bit line structure 160 may extend in the y-direction while being in contact with the surface of the active region 104 exposed to the bit line contact hole CH.

Figure 9C:
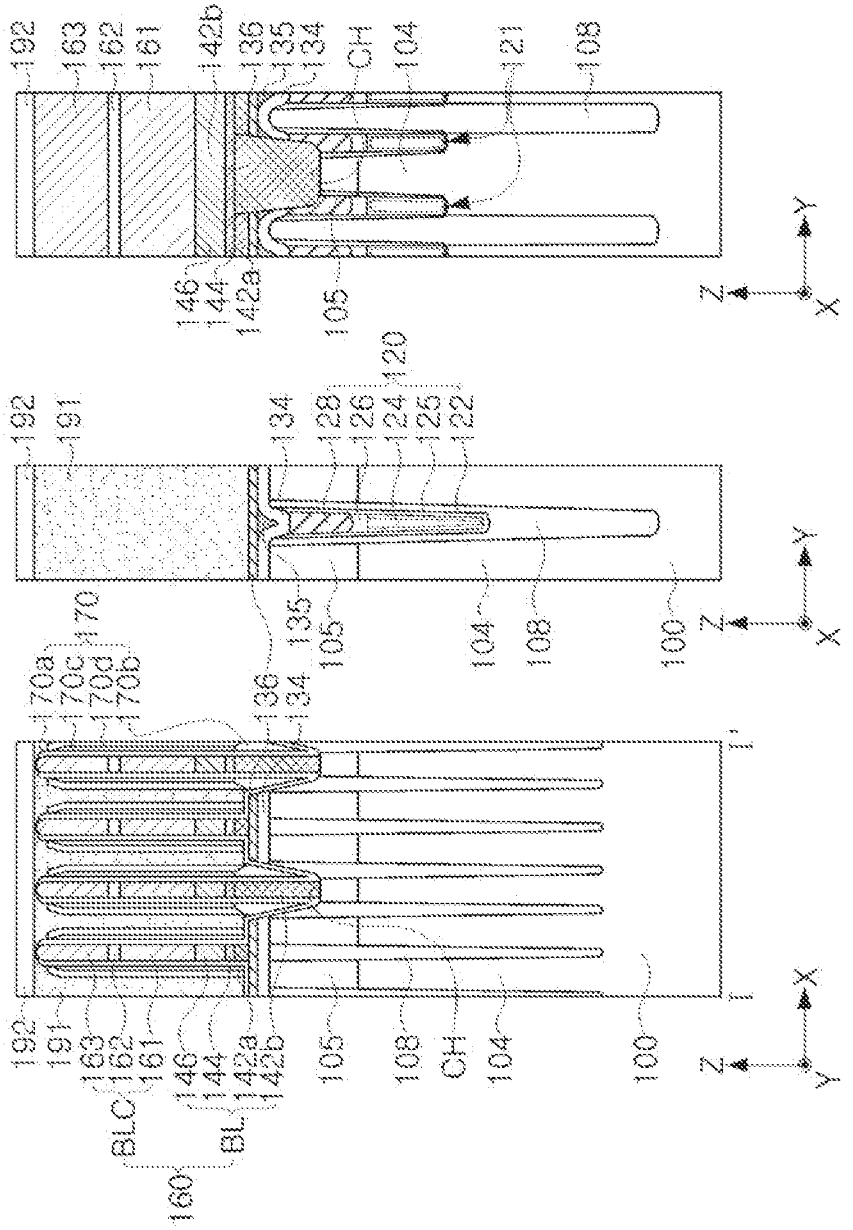

Referring to FIG. 9C, a spacer structure 170 covering the bit line structure 160 may be formed. Each of the spacer structures 170 may include a first spacer 170*a* covering a sidewall and an upper surface of the bit line structure 160, a second spacer 170*b* filling the bit line contact hole CH, third and fourth spacers 170*c* and 170*d* covering a sidewall of the bit line structure 160 and stacked in sequence on the first spacer 170*a*.

Subsequently, a first interlayer insulating layer 191 may be formed while filling the gap between the spacer structures 170. Thereafter, the first interlayer insulating layer 191 may be planarized to expose the upper surface of the spacer structure 170. Thereafter, a second interlayer insulating layer 192 may be formed on the first interlayer insulating layer 191. The first and second interlayer insulating layers 191 and 192 may include, for example, silicon oxide.

Figure 9D:
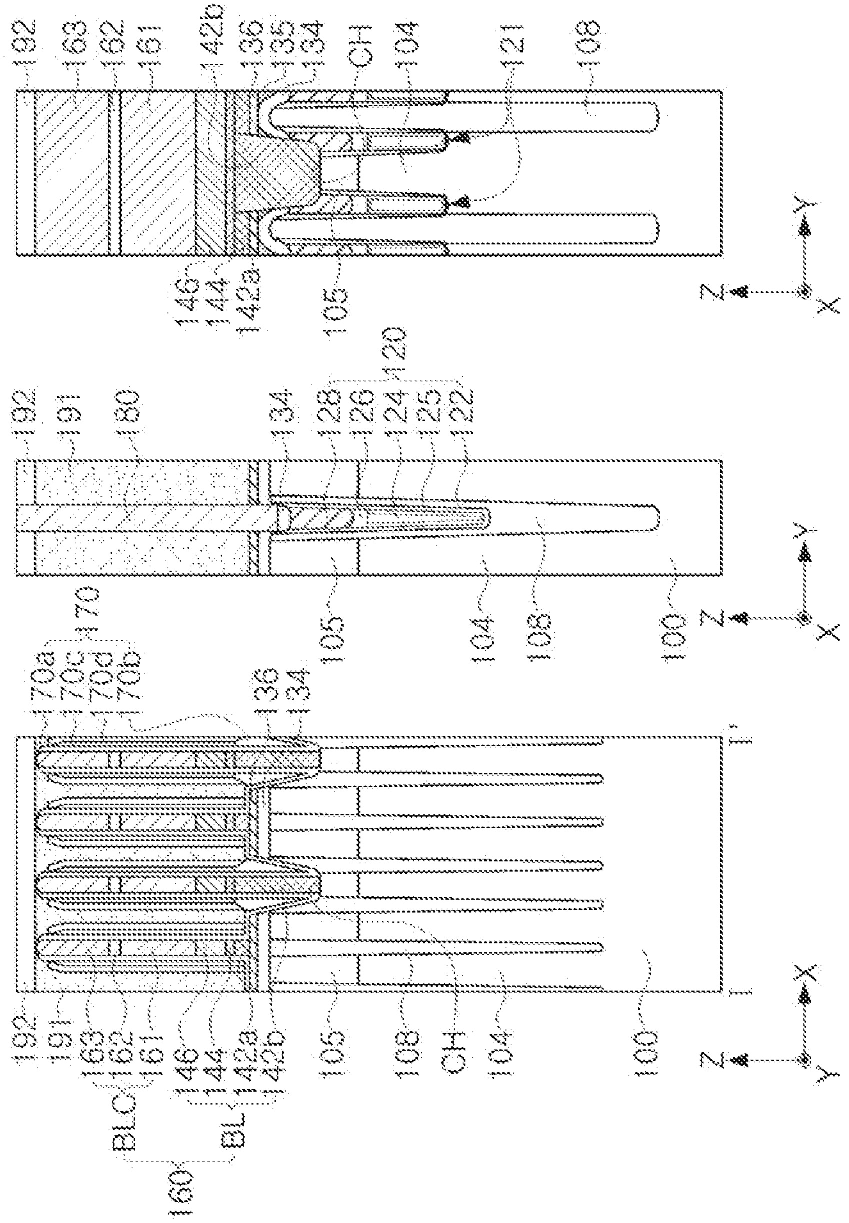

Referring to FIG. 9D, a fence insulating pattern 180 may be formed on the buried gate structures 120. The fence insulating pattern 180 may be formed by etching a portion of the first and second interlayer insulating layers 191 and 192 and the buffer structure 130 and filling the etched portion with an insulating material. The fence insulating pattern 180 may penetrate the first and second interlayer insulating layers 191 and 192 and the second and third buffer patterns 135 and 136, and may be formed by recessing a portion of the first buffer pattern 134. The fence insulating pattern 180 may be formed between the bit line structures 160 adjacent to each other. The fence insulating pattern 180 may be formed of, for example, silicon nitride.

Figure 9E:
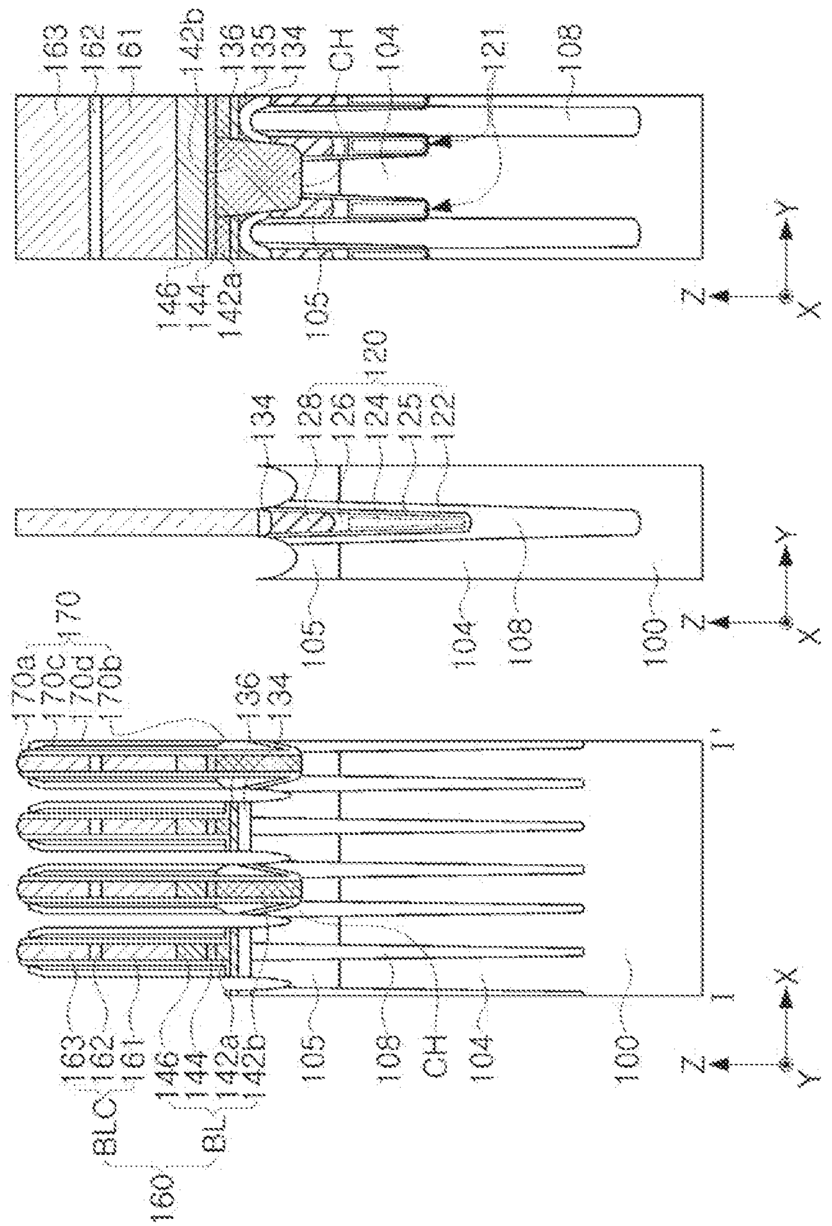

Referring to FIG. 9E, an etching process may be performed using the fence insulating pattern 180 as an etching mask. In a region in which the fence insulating pattern 180 is not formed, the storage node contact hole exposed on the surface of the active region 104 and the device isolation region 108 may be formed by etching the surface portions of the first and second interlayer insulating layers, the buffer structure 130, and the surface portions of the active region 104.

As described in FIG. 9B, since the buffer structure 130 does not include silicon nitride on the active region 104 and the device isolation region 108, the buffer structure 130 may not collapse, which may be caused by the etching process for forming the bit line structure 160. For example, the buffer structure 130 may have a substantially uniform upper surface. Accordingly, the storage node contact holes formed between the adjacent bit line structures 160 may also be uniformly formed, such that the recess distribution of the storage node contact holes may improve.

Also, the active region 104 may have an upper surface disposed on a level higher than a level of the upper surface of the buried gate structures 120 (see FIG. 9D). Accordingly, the amount of etching required to form the storage node contact hole in FIG. 9E may be reduced, thereby reducing burden of the process.

Figure 9F:
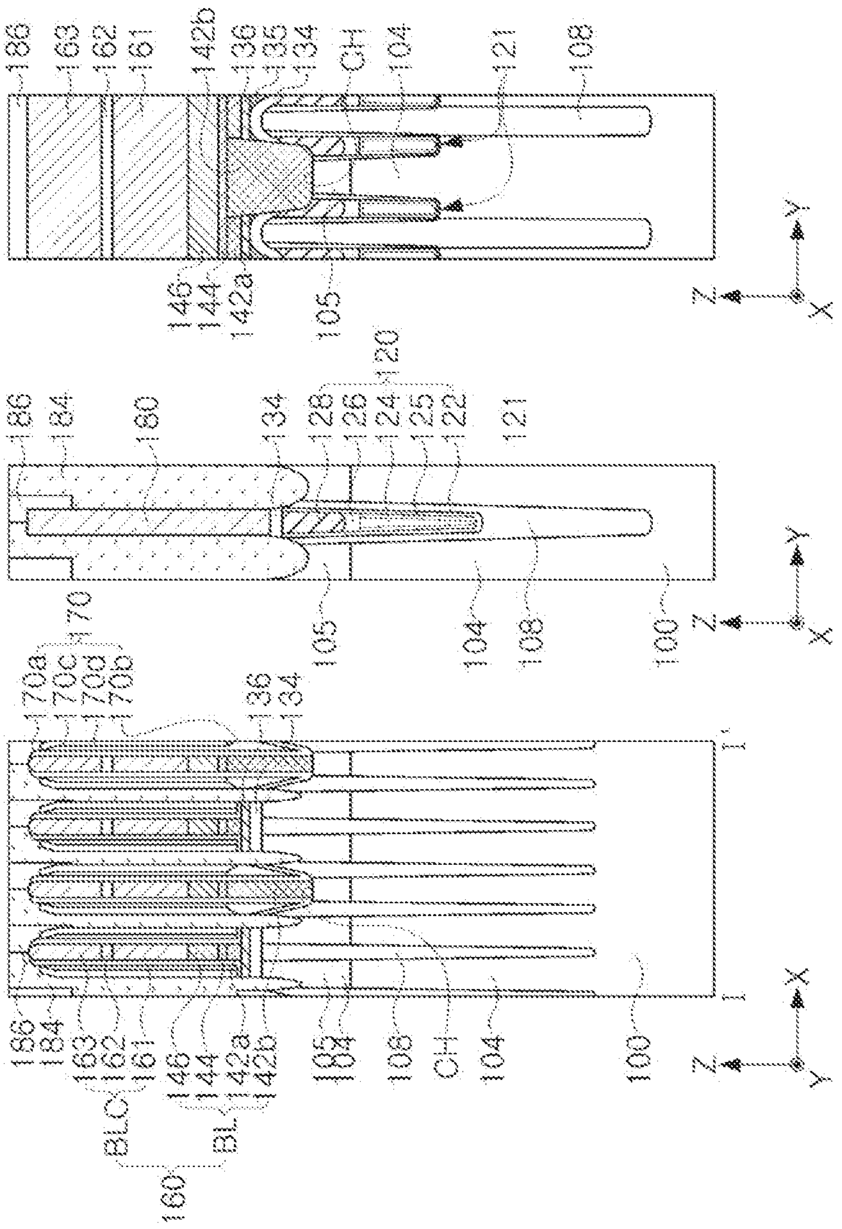

Referring to FIG. 9F, storage node contacts 184 filling the storage node contact hole and having an upper surface disposed on a level higher than a level of the upper surface of the bit line structure 160 may be formed. Also, an upper insulating pattern 186 filling a region between the storage node contacts 184 may be formed.

Referring back to FIG. 2A, the capacitor structure 190 in contact with the upper surfaces of the storage node contacts 184 may be formed. A lower electrode 190*a* may be formed on upper surfaces of the storage node contacts 184, a capacitor dielectric layer 190*b* conformally covering the lower electrode 190*a* and the upper insulating pattern 186 may be formed, and an upper electrode 190*c* covering the capacitor dielectric layer 190*b* may be formed. By performing these processes, a DRAM device illustrated in FIG. 2A may be manufactured.

According to the aforementioned example embodiments, by improving distribution of recesses of the storage node contact holes and reducing the amount of etching the storage node contact holes, process burden may be reduced.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:

active regions defined by a device isolation region in a substrate;

trenches extending lengthwise in a first direction to intersect the active regions;

buried gate structures buried in the trenches, respectively, and having upper surfaces located on a level lower than a level of upper surfaces of the active regions;

a buffer structure covering the active regions, the device isolation region, and the buried gate structures;

bit line structures extending lengthwise in a second direction intersecting the first direction on the active regions and connected to the active regions;

spacer structures that cover sidewalls of the bit line structures and are disposed on the buffer structure;

storage node contacts between the bit line structures, penetrating through the buffer structure and in direct contact with the active regions; and capacitor structures in direct contact with an upper surface of the storage node contacts, wherein the buffer structure includes:

a first buffer pattern extending along profiles of the upper surfaces of the active regions, the device isolation region, and the buried gate structures and having an upper surface including concave portions;

a second buffer pattern including at least first portions filling the concave portions of the upper surface of the first buffer pattern, the second buffer pattern being in direct contact with the first pattern; and a third buffer pattern on the first buffer pattern and the second buffer pattern, the third buffer pattern being in direct contact with the second buffer pattern, wherein each of the bit line structures includes a first portion on an upper surface of the buffer structure and second portions penetrating through the buffer structure, wherein a lowermost portion of a lower surface of the second buffer pattern is at a vertical level farther away from a lower surface of the substrate in a third direction than a vertical level of a lowermost portion of a lower surface of the first buffer pattern, the third direction being perpendicular to the first and second directions, wherein an uppermost portion of an upper surface of the second buffer pattern is at a vertical level farther away from the lower surface of the substrate in the third direction than a vertical level of an uppermost portion of the upper surface of the first buffer pattern, wherein the lowermost portions of the lower surfaces of the first and second buffer patterns face the substrate, wherein the uppermost portions of the upper surfaces of the first and second buffer patterns face away from the substrate in the third direction, wherein the spacer structures are in contact with side surfaces of the first portion of the bit line structure, and wherein the third buffer pattern is in direct contact with a lower surface of the first portion of the bit line structure.

2. The semiconductor device of claim 1, wherein the concave portions of the upper surface of the first buffer pattern are located on the buried gate structures, and wherein the first portions of the second buffer pattern vertically overlap the buried gate structures.

3. The semiconductor device of claim 1, wherein the buffer structure includes:

a first region in which the first to third buffer patterns are stacked in sequence, and a second region in which the third buffer pattern is directly stacked on the first buffer pattern.

4. The semiconductor device of claim 3, wherein the first region of the buffer structure is located on the buried gate structures, and wherein the second region of the buffer structure is located on the active regions and the device isolation region.

5. The semiconductor device of claim 1, wherein the first buffer pattern and the third buffer pattern include silicon oxide, and wherein the second buffer pattern includes silicon nitride.

6. The semiconductor device of claim 1, wherein the second buffer pattern further includes second portions located on the first buffer pattern and connecting the first portions to each other.

7. The semiconductor device of claim 6, wherein a thickness of the second portions is smaller than a thickness of the first portions.

8. The semiconductor device of claim 6, wherein the second portions are located on the first buffer pattern located on the upper surfaces of the active regions and the device isolation region.

9. The semiconductor device of claim 1, wherein a thickness of the first buffer pattern is greater than a thickness of the third buffer pattern.

10. The semiconductor device of claim 1, wherein each of the buried gate structures includes a word line in a corresponding one of the trenches and a capping pattern located on the word line.

11. The semiconductor device of claim 1, wherein an uppermost surface of the third buffer pattern is at a vertical level farther away from the lower surface of the substrate than the vertical level of the uppermost portion of the upper surface of the second buffer pattern.

12. A semiconductor device, comprising:

active regions defined by a device isolation region in a substrate;

buried gate structures intersecting the active regions;

word lines buried in the substrate, extending lengthwise in a first direction, and located on a level lower than a level of upper surfaces of the active regions;

capping patterns buried in the substrate, located on the word lines, and having upper surfaces located on a level lower than a level of the upper surfaces of the active regions;

a buffer structure on the device isolation region, the active regions, and the capping patterns;

bit line structures extending lengthwise in a second direction intersecting the first direction on the active regions and connected to the active regions; and spacer structures that cover sidewalls of the bit line structures and are disposed on the buffer structure, wherein each of the bit line structures includes a first portion on an upper surface of the buffer structure and second portions penetrating through the buffer structure, wherein the buffer structure includes a first region on the active regions and the device isolation region, and a second region on the capping patterns, wherein the first region has a first thickness, wherein the second region has a second thickness greater than the first thickness, wherein the buffer structure includes:

a first buffer pattern extending along profiles of the upper surfaces of the active regions, the device isolation region, and the buried gate structures and having an upper surface including concave portions;

a second buffer pattern including at least first portions filling the concave portions of the upper surface of the first buffer pattern; and a third buffer pattern that is on and in direct contact with the first buffer pattern, and below and in direct contact with the second buffer pattern, wherein a lowermost portion of a lower surface of the second buffer pattern is at a vertical level farther away from a lower surface of the substrate in a third direction than a vertical level of a lowermost portion of a lower surface of the first buffer pattern, the third direction being perpendicular to the first and second directions, wherein an uppermost portion of an upper surface of the second buffer pattern is at a vertical level farther away from the lower surface of the substrate in the third direction than a vertical level of an uppermost portion of the upper surface of the first buffer pattern, wherein the lowermost portions of the lower surfaces of the first and second buffer patterns face the substrate, wherein the uppermost portions of the upper surfaces of the first and second buffer patterns face away from the substrate in the third direction, and wherein the second buffer pattern is in direct contact with a lower surface of the first portion of the bit line structure.

13. The semiconductor device of claim 12, wherein a lower surface of the buffer structure has a shape according to profiles of the upper surfaces of the substrate and the capping patterns.

14. The semiconductor device of claim 12, wherein the first region of the buffer structure includes at least a first silicon oxide layer, and wherein the second region of the buffer structure includes the first silicon oxide layer and a silicon nitride layer deposited on the first silicon oxide layer.

15. The semiconductor device of claim 14, wherein the buffer structure further includes a second silicon oxide layer covering the first silicon oxide layer and the silicon nitride layer in the first and second regions.

16. The semiconductor device of claim 12, wherein the buffer structure includes:

the first region in which the first to third buffer patterns are stacked in a sequence of the first buffer pattern, the third buff er pattern, and the second buffer pattern, and the second region in which the second buffer pattern is directly stacked on the first buffer pattern.

17. A semiconductor device, comprising:

an isolation region defining an active region within a substrate;

buried gate structures intersecting the active region, extending lengthwise into the isolation region, and having upper surfaces located on a level lower than a level of an upper surface of the active region;

a first buffer pattern on the buried gate structures and the isolation region, and having an upper surface including concave portions on the buried gate structures;

a second buffer pattern filling the concave portions of the upper surface of the first buffer pattern and including at least first portions vertically overlapping the buried gate structures;

a bit line structure on the active region and connected to the active region; and spacer structures that cover sidewalls of the bit line structure and are disposed on the second buffer pattern, wherein the bit line structure includes a first portion on an upper surface of the second buffer pattern and a second portion penetrating through the first and second buffer patterns, wherein the second buffer pattern is in direct contact with the first buffer pattern, wherein a lowermost portion of a lower surface of the second buffer pattern is at a vertical level farther away from a lower surface of the substrate in a vertical direction than a vertical level of a lowermost portion of a lower surface of the first buffer pattern, the vertical direction being perpendicular to a horizontal upper surface of the isolation region, wherein an uppermost portion of an upper surface of the second buffer pattern is at a vertical level farther away from the lower surface of the substrate in the vertical direction than a vertical level of an uppermost portion of the upper surface of the first buffer pattern, wherein the lowermost portions of the lower surfaces of the first and second buffer patterns face the substrate, wherein the uppermost portions of the upper surfaces of the first and second buffer patterns face away from the substrate in the vertical direction, and wherein the second buffer pattern is in direct contact with a lower surface of the first portion of the bit line structure.

18. The semiconductor device of claim 17, wherein each of the buried gate structures includes a word line and a capping pattern on the word line, and wherein the first buffer pattern is in direct contact with the capping pattern.

19. The semiconductor device of claim 17, wherein the first portions of the second buffer pattern extend in a first horizontal direction, and wherein each of first and second portions of the bit line structure extends lengthwise in a second horizontal direction intersecting the first horizontal direction.

20. The semiconductor device of claim 17, wherein the second buffer pattern includes:

the first portions filling the concave portions of the first buffer pattern, and second portions disposed on the first buffer pattern and connecting the first portions to each other.

* * * * *